(12) United States Patent
Yamaki

(10) Patent No.: US 8,592,825 B2
(45) Date of Patent: Nov. 26, 2013

(54) SEMICONDUCTOR DEVICE HAVING SI-SUBSTRATE AND PROCESS TO FORM THE SAME

(75) Inventor: Fumikazu Yamaki, Osaka (JP)

(73) Assignee: Sumitomo Electric Industries Ltd., Osaka (JP)

( * ) Notice: Subject to any disclaimer, the term of this patent is extended or adjusted under 35 U.S.C. 154(b) by 91 days.

(21) Appl. No.: 13/189,957

(22) Filed: Jul. 25, 2011

(65) Prior Publication Data
US 2012/0025204 A1    Feb. 2, 2012

(30) Foreign Application Priority Data
Jul. 27, 2010 (JP) .................................. 2010-168430
Jul. 27, 2010 (JP) .................................. 2010-168431

(51) Int. Cl.
*H01L 29/16* (2006.01)
*H01L 23/48* (2006.01)
*H01L 29/20* (2006.01)
*H01L 21/50* (2006.01)

(52) U.S. Cl.
USPC ........ 257/77; 257/774; 257/76; 257/E23.011; 257/E29.089; 257/E29.082; 257/E21.499

(58) Field of Classification Search
USPC ............. 257/77, 774, 76, E23.011, E29.089, 257/E29.082, E21.499; 438/106
See application file for complete search history.

(56) References Cited

U.S. PATENT DOCUMENTS
2006/0205161 A1 * 9/2006 Das et al. ..................... 438/284

OTHER PUBLICATIONS
Eli Reese et al., "Wideband Power Amplifier MMICs Utilizing GaN an SiC", IEEE International Microwave Symposium, 2010, pp. 1230-1233.

* cited by examiner

*Primary Examiner* — Jarrett Stark
*Assistant Examiner* — Lawrence Tynes, Jr.
(74) *Attorney, Agent, or Firm* — Smith, Gambrell & Russell, LLP

(57) ABSTRACT

A semiconductor device and a process to form the semiconductor device are disclosed. The semiconductor device includes a Si substrate, active devices primarily made of nitride based compound semiconductor material, and passive devices. The Si substrate includes a via hole piercing from the back surface to the primary surface of the Si substrate. The active device is mounted on the primary surface so as to cover at least a portion of the via hole. The metal layer cover the whole back surface, inner surfaces of the via hole, and the back surface of the active device exposed in the via hole.

6 Claims, 10 Drawing Sheets

SEMICONDUCTOR DEVICE HAVING Si-SUBSTRATE AND PROCESS TO FORM THE SAME

BACKGROUND OF THE INVENTION

1. Field of the Invention

The present invention relates to a semiconductor device and a process to form the semiconductor device. In particular, the invention relates to a semiconductor device including an active device made of nitride based compound semiconductor material, and a substrate made of silicon (Si).

2. Related Background Art

One type of semiconductor devices has been well known as, what is called, a monolithic microwave integrated circuit (hereafter denoted as MMIC). Eli Reese et al. have disclosed one of such MMICs in the digest of IEEE International Microwave Symposium 2010, pp. 1230 to 1233. The MMIC disclosed therein has an arrangement of the substrate made of silicon carbide (SiC) and a gallium nitride (GaN) layer epitaxially grown on the SiC substrate. Such an MMIC with the SiC substrate inherently shows excellent heat dissipation and high frequency performance.

However, available SiC substrates are generally cost ineffective, which inevitably raises the market price of the MMIC applying the SiC substrate. Another material for the substrate has been investigated. In particular, a substrate made of silicon (Si) has various advantages when it is applied to the MMIC except that Si has the thermal conductivity less than that of SiC. Accordingly, additional or especial arrangement to dissipate heat from the active device made of nitride based material is necessary to use Si substrate for the MMIC.

SUMMARY OF THE INVENTION

An aspect of the present invention relates to a semiconductor device type of the MMIC that includes a Si substrate, a metal layer, and an active device. The Si substrate includes a via hole that pierces from the back surface of the Si substrate to the primary surface thereof. The metal layer covers the whole back surface and the inner surface of the via hole. The active device may be made of nitride based compound semiconductor material. A feature of the semiconductor device of the invention is that at least a portion of the active device comes in directly contact with the metal layer which is exposed in the primary surface of the Si substrate.

Another aspect of the present invention relates to a process to form the MMIC. The process comprises: (a) first mounting an active device on a Si substrate; (b) second digging a via hole that pierces from the back surface to the primary surface of the Si substrate; and (c) then, depositing the metal layer on the whole back surface of the Si substrate, the inner surface of the via hole, and the back surface of the active device exposed in the via hole.

Another process according to the present invention comprises: (a) first digging the via hole that pierces from the back surface to the primary surface of the Si substrate; (b) second depositing the metal layer on the whole back surface of the Si substrate, the inner surface of the via hole; and (c) then, mounting the active device on the metal layer such that a portion of the active device comes in directly contact with the metal layer exposed in the primary surface of the Si substrate.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS

Next, some preferred embodiments according to the present invention will be described. In the description of the drawings, the same numerals or symbols will refer to the same elements without overlapping explanations.

Figure 1:
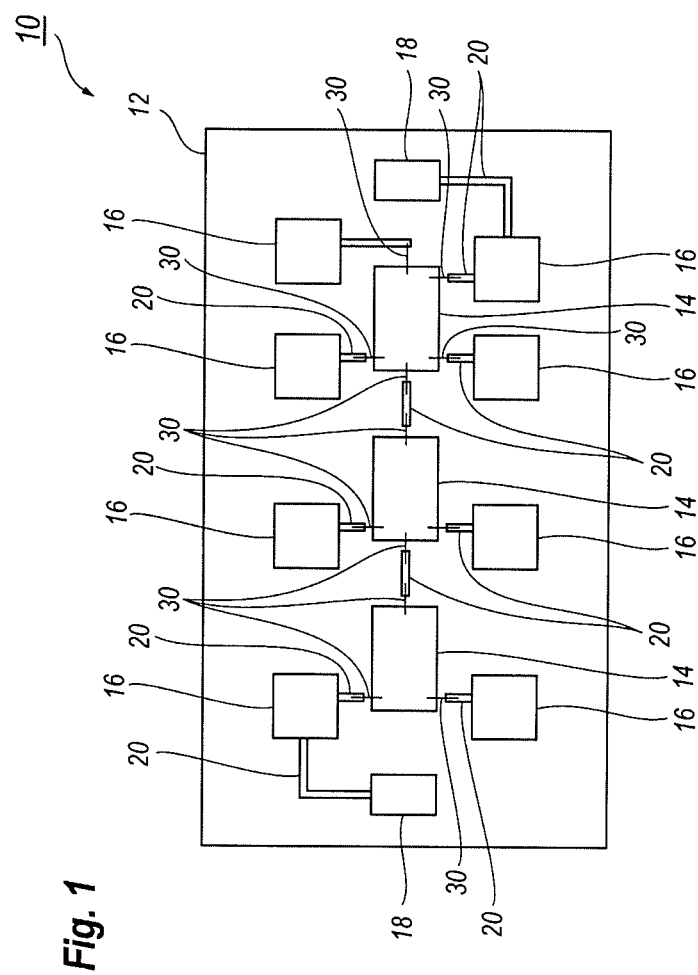
FIG. 1 shows a plan view of an MMIC according to an embodiment of the present invention.

FIG. 1 is a plan view of a semiconductor device according to an embodiment of the present invention. The semiconductor device 10 shown in FIG. 1 has a type of an MMIC. As illustrated in FIG. 1, the semiconductor device 10 includes a substrate 12 made of silicon (Si), some active devices 14, some passive devices 16, two terminals 18, interconnections 20, and boding wires 30.

The passive devices 16, which are capacitors and inductors, may be formed on the Si substrate 12 by an ordinary semiconductor process, or independently formed and mounted on the Si substrate 12. Two terminals 18 show a function for the device 10 to communicate with an external circuit. The interconnections 20 and the bonding wires 30 may electrically connect the active devices 14 with the passive devices 16 or the terminals 18.

Figure 2:
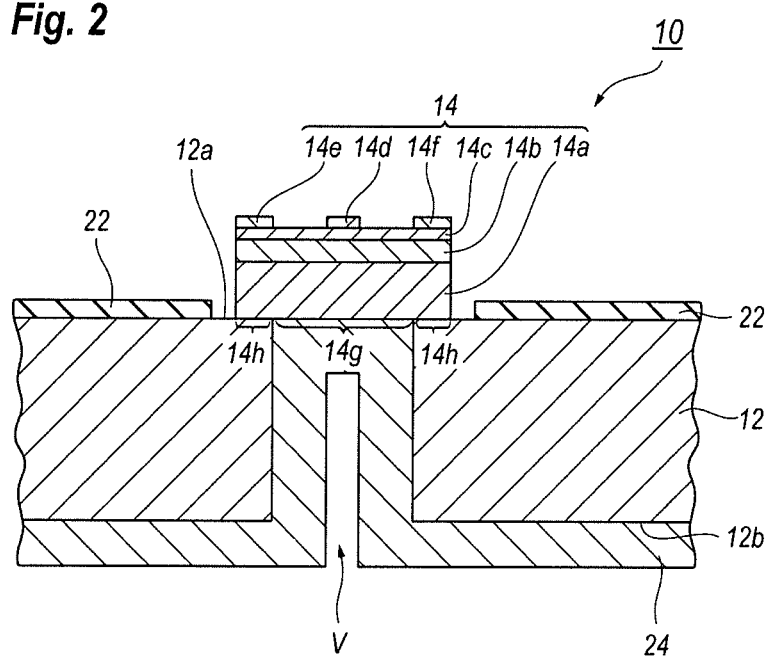
FIG. 2 is a cross section of the MMIC of FIG. 1, which is taken along a line intersecting an active device.

FIG. 2 shows a cross section of the semiconductor device 10. The active device 14 may be made of compound semiconductor material including nitrogen (N), specifically, the active device 14 according to the present embodiment may be, what is called, a HEMT (High Electron Mobility Transistor) made of nitride based compound semiconductor material. As illustrated in FIG. 2, the active device 14 includes a semiconductor substrate 14a, first and second semiconductor layers, 14b and 14c, a gate electrode 14d, a source electrode 14e, and a drain electrode 14f.

The semiconductor substrate 14a may be made of SiC or GaN. The first semiconductor layer 14b, which is epitaxially grown on the semiconductor substrate 14a, may be made of intrinsic GaN (i-GaN), where intrinsic means that the semiconductor material is not intentionally doped. The second semiconductor layer 14c, which is also epitaxially grown on the first semiconductor layer 14b, may be made of n-type AlGaN. Three electrodes of the gate 14d, the source 14e, and the drain 14f are arranged on the second semiconductor layer 14c such that the gate 14d is put between the drain 14f and the source 14e.

The silicon substrate 12, which includes a primary surface 12a and a back surface 12b, arranges an insulating layer 22 made of silicon oxide ($SiO_2$) or silicon nitride (SiN) on the primary surface 12a thereof. The silicon substrate 12 further includes a via hole V piercing from the back surface 12b to the primary surface 12a. A metal layer 24 covers inner surfaces of the via hole V and the whole back surface 12b of the Si substrate 12. The metal layer 24 may be made of gold (Au).

The metal layer 24 in an arrangement thereof is not restricted to a single metal layer. A multi-layered metal may be applicable. Specifically, Au film is first deposited on the back surface 12b and surfaces forming the via hole V, then another metal including molybdenum (Mo) and copper (Cu) are stacked on the Au film. The Mo layers and the Cu layers may be alternately stacked to each other. Molybdenum has the thermal expansion co-efficient nearly equal to that of the SiC, while, copper shows relatively larger to thermal conductivity. Accordingly, when the semiconductor substrate 14a is made of SiC and the metal layer 24 including Mo and Cu come in contact with the semiconductor substrate 14c; the satisfactory heat dissipation from the active device 14 without substantial stress may be realized.

A periphery of the via hole V eliminates the insulating film 22 in the primary surface 12a, while, the active device 14 is mounted on this area exposing the primary surface 12a. Thus, the primary surface 12a of the Si substrate 12 provides a function to mount the active device directly thereon. The active device 14 has a back surface facing the primary surface of the Si substrate 12. The back surface includes a first portion 14g and a second portion 14h. The first portion 14g comes in contact with the meal layer 24; while, the second portion 14h, which surrounds the first portion 14g comes in contact with the primary surface 12a of the Si substrate 12.

Figure 3A:
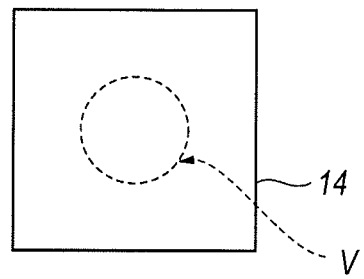
FIGS. 3A to 3C show plane relations between the active device and the via hole formed in the substrate.
Figure 3B:
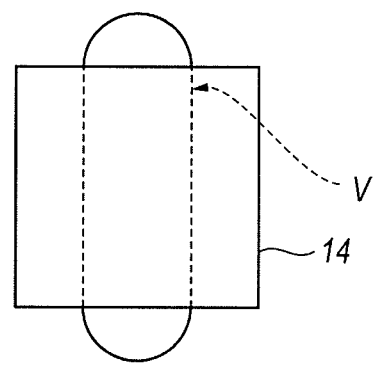
Figure 3C:
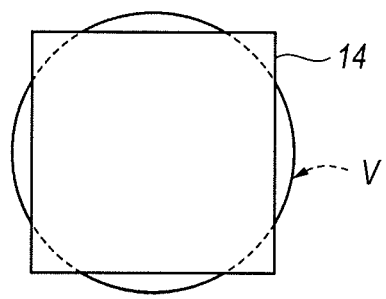

FIGS. 3A to 3C schematically illustrate the plane relation between the active device 14 and the via hole V. As shown in FIG. 3, the active device 14 ordinarily has a size fully covering the via hole V. In alternates, the via hole V may have a size exceeding the active device 14 as shown in FIGS. 3B or 3C. At least a width of the via hole V in one direction is less than a width of the active device 14 along this direction; then, the active device 14 may be securely mounted on the Si substrate 12.

In any cases shown in FIGS. 3A to 3C, the via hole V may be decreased in the size thereof, which may reduce the amount of metal for the metal layer 24. In particular, the via hole V of those shown in FIG. 3A makes the metal amount for the layer 24 minimum.

Moreover, in the arrangement of the active device 14 relative to the via hole V shown in FIGS. 3A to 3C, a portion of the back surface of the active device 14, which is denoted as the portion 14g in FIG. 2, comes in contact with the metal layer 24 in the via hole V; while, at least two edge portions of the back surface of the active device 14, which is denoted as the portion 14h in FIG. 2, come in contact with the primary surface 12a of the Si substrate 12. Thus, the arrangement according to the present embodiment may cope with both the heat dissipation function of the active device 14 and the secure mounting for the active device 14. As explained in later embodiments, the plane relation between the active device 14 and the via hole V is not restricted to those shown in FIGS. 3A to 3C; the via hole V in a size thereof may be wider than the size of the active device 14.

The semiconductor device 10 may reduce a cost thereof because of the Si substrate 12 for mounting the active device 14. Specifically, the semiconductor device 10 mounts passive devices 16, which generate less heat, on the Si substrate 12; but mounts active devices 14, which generate larger heat, on the metal layer 24. An effective heat dissipation mechanism may be realized in the Si substrate 12.

(Second Embodiment)

Figure 4A:
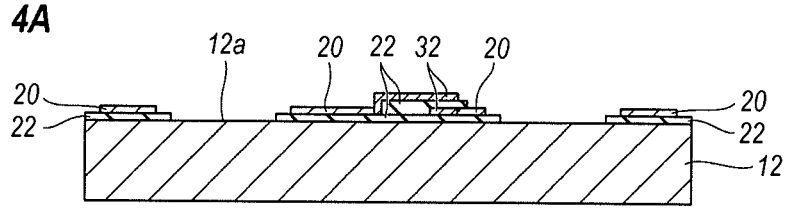
FIGS. 4A to 4E show processes to form the MMIC according to the second embodiment of the invention.
Figure 4B:
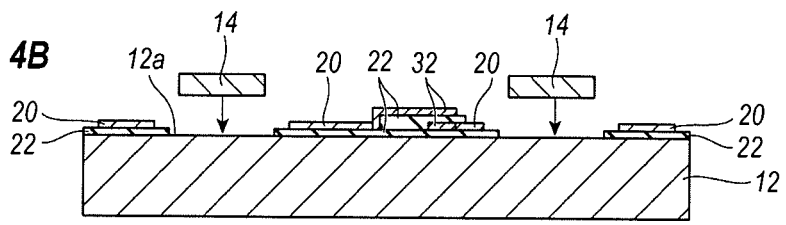

Next, a process to manufacture the semiconductor device 10 will be described. FIGS. 4A to 4E show processes for the semiconductor device 10. First, the process forms, on the primary surface of the Si substrate 12, an insulating film 22, a plurality of electrodes 32, and interconnections 20. The passive devices 16 include the electrodes 32 and the insulating film 22. Subsequently, the process removes a portion of the insulating film 22 covering an area where the active device 14 is to be mounted, as shown in FIG. 4A. The removal of the insulating film 22 may be carried out by, for instance, a dry-etching, a wet-etching or any other conventional techniques. The active devices 14 as shown in FIGS. 1 and 2, are prepared in advance to the process thus described above.

Then, the process mounts the active devices 14 on the primary surface 12a of the Si substrate 12 where the insulating film 22 is removed. The active device 14 may have an Au film in the back surface thereof; and the mounting of the active device 14 on the primary surface 12a may be carried out by the eutectic reaction between two Au films on the back surface of the active device 14 and on the primary surface 12a.

Figure 4C:
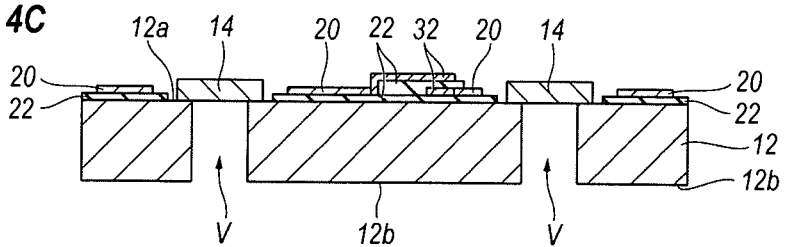

Then, the process digs the via hole V from the back surface 12b reaching to the primary surface 12a of the substrate 12 (FIG. 4C). In this process, the active device 14 covers the via hole V in the primary surface 12a. The dry-etching, the wet-etching, or other conventional techniques may dig the via hole V.

Figure 4D:
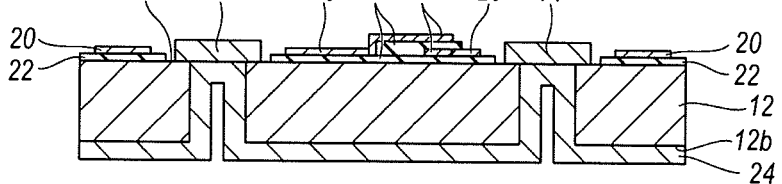
Figure 4E:
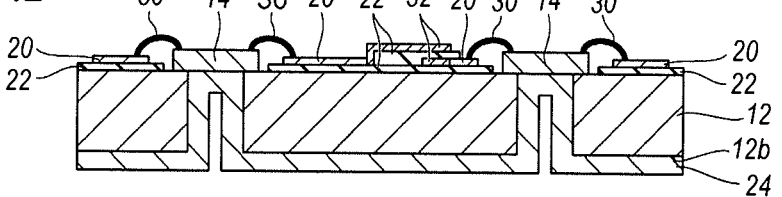

Next, the process forms the metal layer 24 so as to cover the whole back surface of the Si substrate 12, the inner surface forming the via hole V and the back surface of the active device 14. The metal layer 24 may be formed by, for instance, the conventional plating technique (FIG. 4D). Finally, connecting the active device 14 in three electrodes thereof, 14d to 14f, to the interconnections 20 on the Si substrate 14 with bonding wires 30, the semiconductor device 10 may be completed (FIG. 4E).

(Third Embodiment)

Figure 5A:
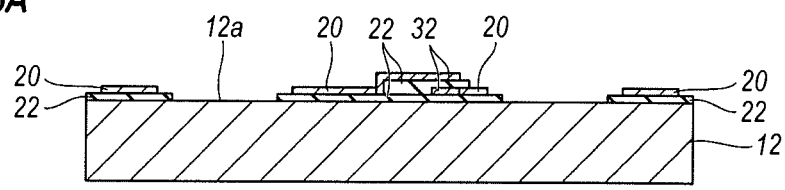
FIGS. 5A to 5D show processes to form the MMIC according to the third embodiment of the invention.
Figure 5B:
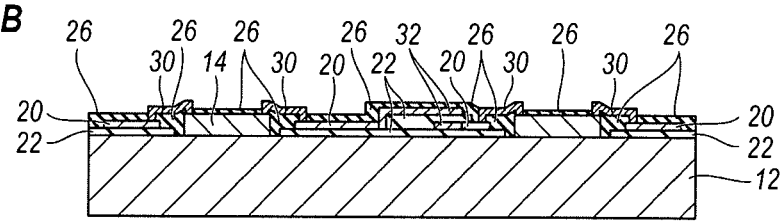

Next, a modified process according to the third embodiment of the invention will be described. FIGS. 5A to 5E show processes for forming the semiconductor device 10 according to the third embodiment of the invention. The process of the present embodiment first carries out the same process of the first embodiment shown in FIG. 4A; specifically, the process forms the passive devices 16 with the electrodes 32 on the primary surface 12a, then, removes the insulating film 22 in the area where the active device 14, which is independently prepared, is to be mounted thereon (FIG. 5A).

Figure 5C:
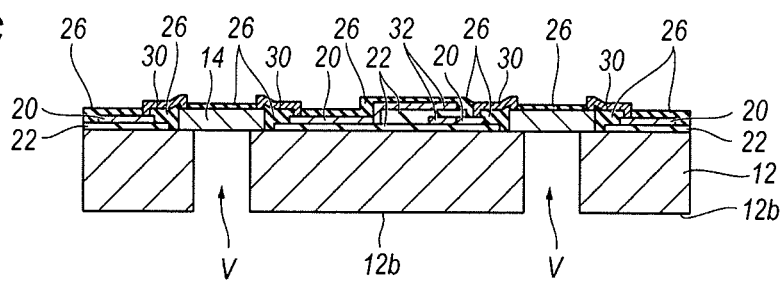

Next, another insulating film 26 covers the whole primary surface 12a and that of the active device 14. Interconnections 30 are subsequently formed on the other insulating film 26 by, for instance, a conventional plating technique. Then, the process digs the via hole V so as to pierce from the back surface 12b to the primary surface 12a (FIG. 5C).

Figure 5D:
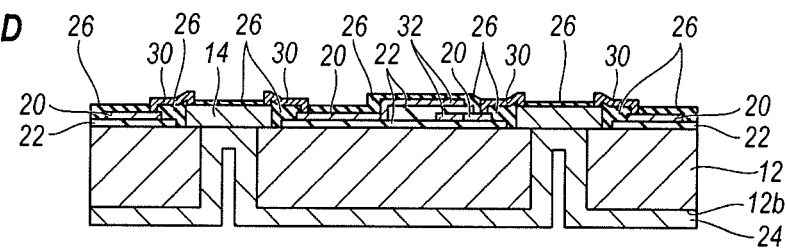

Finally, the metal layer 24 covers the whole back surface 12b of the substrate 12, the inner surface of the via hole V, and the back surface of the active device 14 by plating; thus, the semiconductor device 10 is completed (FIG. 5D). The semiconductor device 10 formed by the process of the third embodiment eliminates bonding wires to connect between devices on the primary surface 12a. Instead, the semiconductor device 10 provides interconnections 30 formed on the other insulating film 26, which may reduce the process cost.

(Fourth Embodiment)

Still another embodiment according to the present invention will be described. FIGS. 6A to 6E show a process according to the fourth embodiment of the invention. Features of the present process is that the formation of the via hole V and the metal layer 24 are carried out in advance of mounting the active device 14 on the primary surface 12a of the Si substrate 12.

Figure 6A:
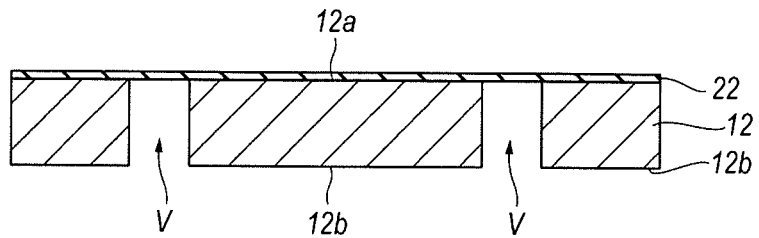
FIGS. 6A to 6E show processes to form the MMIC according to the fourth embodiment of the invention.
Figure 6B:
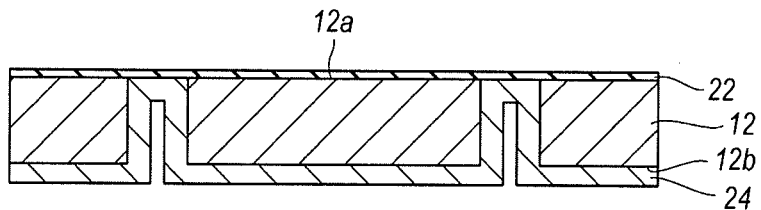

Specifically, as shown in FIG. 6A, the process first deposits the insulating film 22 on the primary surface 12a of the Si substrate 12, then, just after the formation of the insulating film 22, the via hole V is dug from the back surface 12b of the Si substrate 12 (FIG. 6A), and the metal layer 22 covers the whole back surface 12b, the inner surface of the via hole V, and the insulating film 22 exposed within the via hole V (FIG. 6B).

Figure 6C:
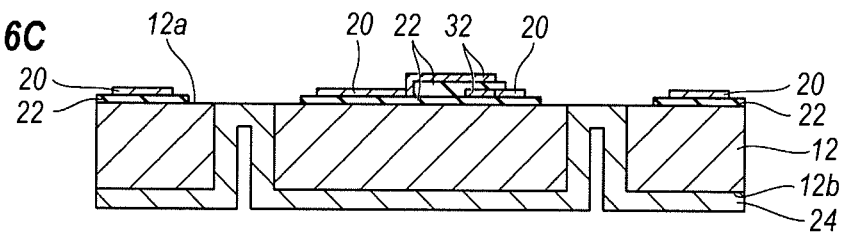
Figure 6D:
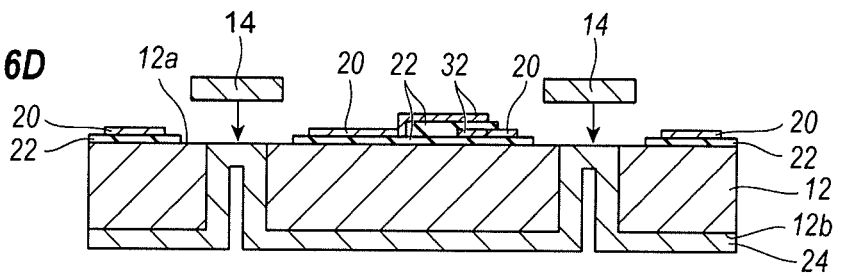
Figure 6E:
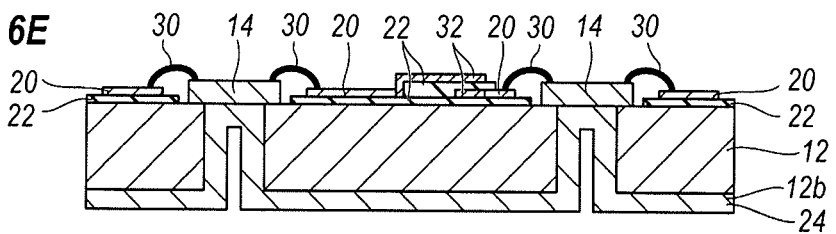

Next, the process forms the passive devices 16 with electrodes 32, interconnections 20 and additional insulating film 24 on the insulating film 22, then removes a portion of the insulating film 22 corresponding to an area where the active device 14 is to be mounted thereon (FIG. 6C). The process, as shown in FIG. 6D, mounts the active device 14 on the primary surface 12a of the Si substrate 12 exposed in the area where the insulating film is removed. Finally, the bonding wires 30 connect respective electrodes, 14d to 14f, of the active device 14, the passive devices 16, and the terminals 18; thus, the semiconductor device 10 is completed (FIG. 6E).

(Fifth Embodiment)

Figure 7:
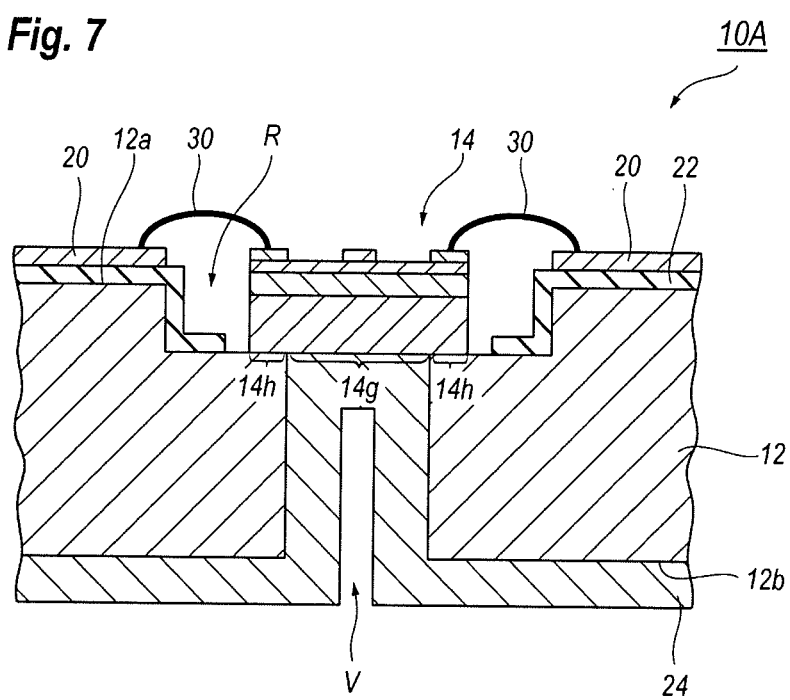
FIG. 7 is a cross section of the MMIC including the active device, which is according to the fifth embodiment of the present invention.

The semiconductor device 10 according to the present invention may further provide various arrangement of the Si substrate 12 and the process to form the device 10. FIG. 7 is a cross section showing the fifth embodiment of the present invention. The semiconductor device 10A shown in FIG. 7 has a hollow R in the primary surface 12a of the Si substrate 12 into which the active device 14 is mounted. The insulating film 22 may penetrates within the hollow R. In the semiconductor device 10A shown in FIG. 7, the depth of the hollow R is nearly equal to the thickness or the height of the active device 14. Accordingly, the top level of the active device 14, specifically, the level of respective electrodes, 14d to 14f, may be substantially equal to that of the interconnections 20, which may shorten the length of the bonding wire 30 and reduce the parasitic component attributed to the bonding wire 30.

(Sixth Embodiment)

Figure 8A:
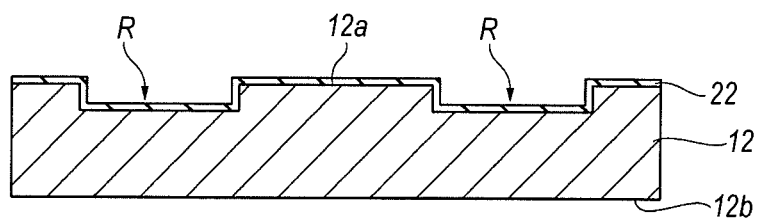
FIGS. 8A to 8E show processes to form the MMIC according to the sixth embodiment of the present invention.
Figure 8B:
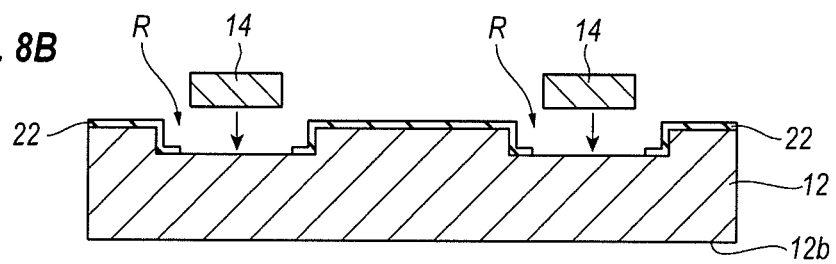

Next, the process to form the semiconductor device 10A shown in FIG. 7 will be described as referring to FIGS. 8A to 8E. The process first forms the hollow R in the primary surface 12a of the Si substrate 12 and covers the whole primary surface 12a including the hollow R by the insulating film 22 (FIG. 8A). Then, removing a portion of the insulating film 22 in the hollow R, the active device 14 is mounted on the exposed primary surface 12a within the hollow R.

Figure 8C:
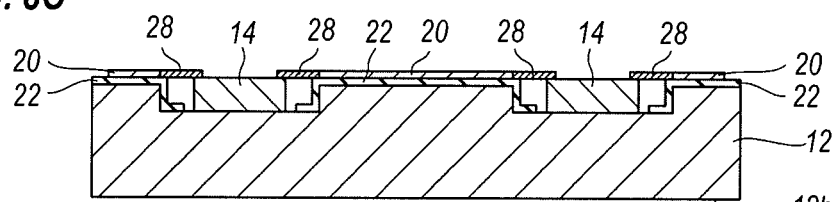
Figure 8D:
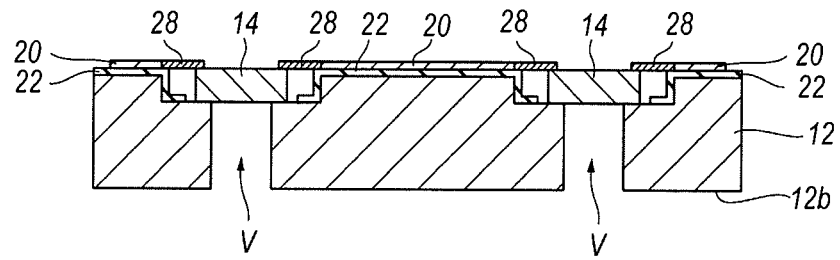
Figure 8E:
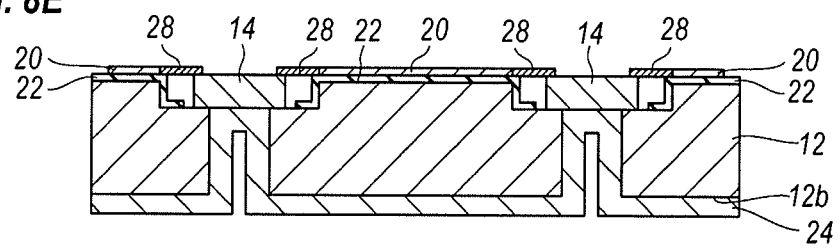

Next, the process forms the interconnections 20 on the insulating film 22 and the wiring 28 connecting the active device 14 with the interconnections 20. The wiring 28 may be formed concurrently with the interconnections 20 by, for instance, plating. Specifically, a patterned photo-resist is prepared on the insulating film 22, where the pattern formed in the photo-resist corresponds to the interconnections 20 and the wirings 28. Plating a metal such as gold (Au) and removing the patterned photo-resist thereafter, the interconnections 20 and the wirings 28 are formed at the same time. As shown in FIG. 8C, the wiring 28 makes a vacancy thereunder in the hollow R, that is, the wiring 28 is a type of, what is called, the air-bridge in the hollow R.

Then, process digs the via hole V so as to pierce the Si substrate 12 from the back surface 12b to the primary surface 12a (FIG. 8D), and the metal layer 24 covers the whole back surface 12b of the Si substrate 12, the inner surface of the via hole V and the back surface of the active device 14 exposed within the via hole V; thus, the process to form the semiconductor device 10A is completed.

(Seventh Embodiment)

Figure 9:
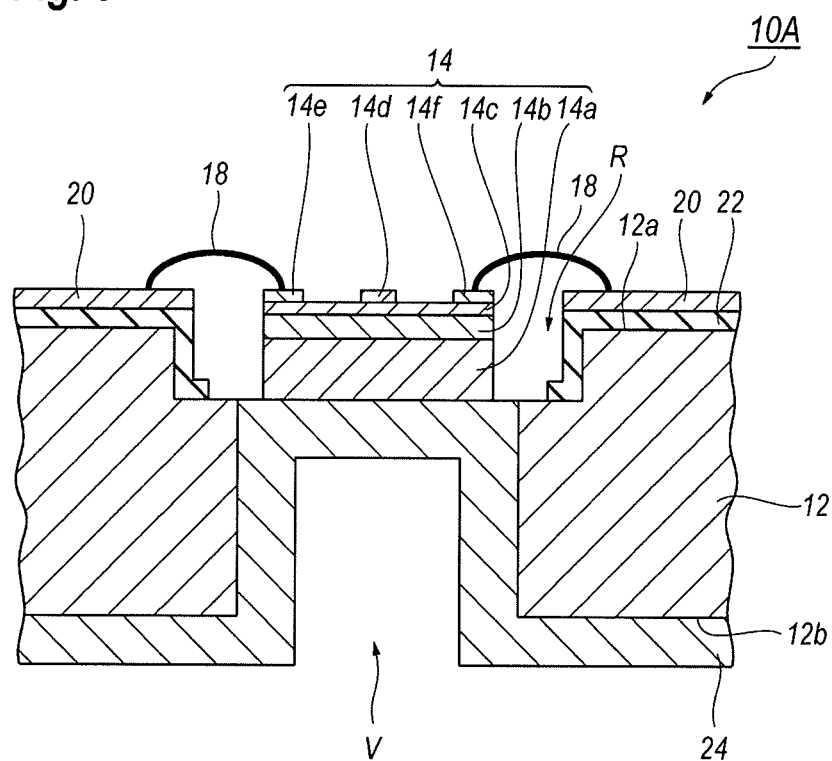
FIG. 9 is a cross section of the MMIC including the active device, which is the seventh embodiment of the present invention.
Figure 10A:
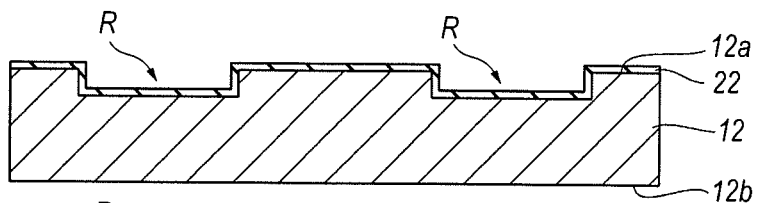
FIGS. 10A to 10F show processes to form the MMIC shown in FIG. 9 according to the eighth embodiment of the present invention.
Figure 10B:
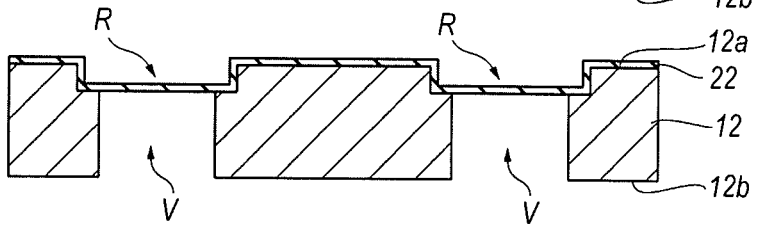
Figure 10C:
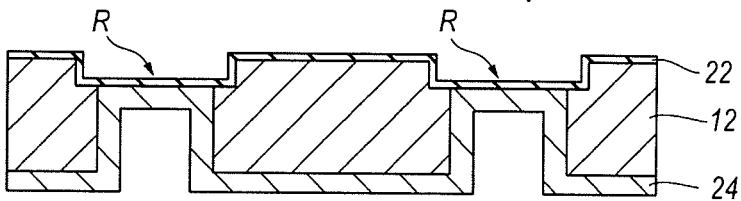
Figure 10D:
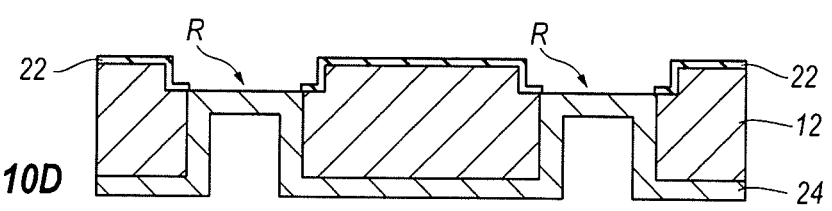
Figure 10E:
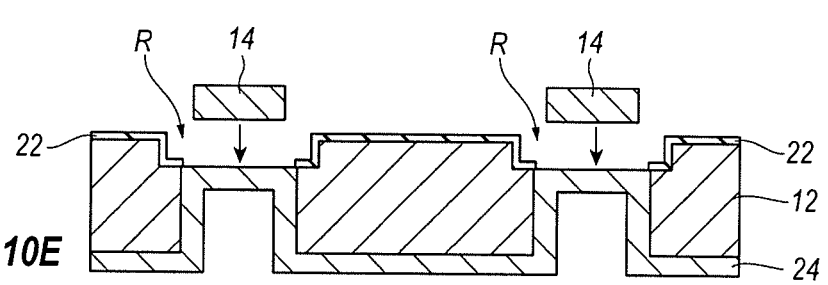
Figure 10F:
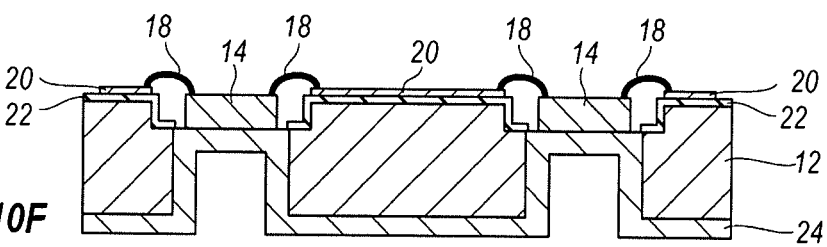

FIG. 9 is a cross section of the semiconductor device 10A according to still another embodiment of the invention. The Si substrate 12 also includes the hollow R similar to those of aforementioned embodiment. The present semiconductor device 10A has a feature that the active device 14 is fully mounted on the metal layer 24. That is, the back surface of the active device 14 does not come in contact with the primary surface 12a of the Si substrate 12 nor the bottom of the hollow R. Only the metal layer 24 exposed in the bottom of the hollow R comes in contact with the active device 14.

(Eighth Embodiment)

The process to form the semiconductor device shown in FIG. 9 will be described as referring to FIGS. 10A to 10F. The process first forms the hollow R in the primary surface 12a of the Si substrate 12 by an ordinary technique, then covers the whole primary surface 12a including the hollow R with the insulating film 22. Next, the process digs the via hole V, by a conventional technique, from the back surface 12b to the primary surface 12a. Then the metal layer 24 covers the whole back surface 12b, the inner surfaces of the via hole V, and the back surface of the insulating layer 22 exposed within the via hole V.

Removing the insulating film 22 within the hollow R, which exposes the metal layer 24 in the hollow R (FIG. 4D), the process mounts the active device 14 in an area where the insulating film 22 is removed in the hollow R (FIG. 4E). Wire-bonding the electrodes, 14f to 14h, of the active device 14 with the interconnections 20 on the insulating film 22 (FIG. 4F), the process to form the semiconductor device 10A is completed.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A semiconductor device, comprising:
   a substrate made of silicon (Si), the silicon substrate having a via hole piercing from a back surface thereof to a primary surface thereof;
   a metal layer covering the back surface of the silicon substrate and an inner surface of the via hole such that the metal layer is exposed at the primary of the silicon substrate through the via hole; and
   an active device made of nitride based compound semiconductor material, the active device including an active device substrate that faces the silicon substrate and that is made of silicon carbide (SiC) or gallium nitride (GaN),
   wherein at least a portion of the active device substrate is in direct contact with the metal layer exposed at the primary surface of the silicon substrate.

2. The semiconductor device of claim 1,
   wherein the via hole in the primary surface of the silicon substrate is fully covered by the active device substrate.

3. The semiconductor device of claim 1,
wherein the substrate further includes a hollow in the primary surface of the Si substrate, the via hole being formed in the hollow.

4. The semiconductor device of claim 3,
wherein the active device has a top leveled with a top of an interconnection formed on the primary surface of the substrate.

5. The semiconductor device of claim 3,
wherein the active device is fully mounted on the metal layer exposed within the hollow.

6. The semiconductor device of claim 3,
wherein the active device is electrically connected with an interconnection provided on the primary surface of the substrate by an air-bridge.

* * * * *